Jan. 11, 1966 A. E. POPODI 3,229,227

PULSED OSCILLATORS

Filed Feb. 6, 1964

INVENTOR
ALFRED E. POPODI

BY

ATTORNEYS

United States Patent Office 3,229,227
Patented Jan. 11, 1966

3,229,227
PULSED OSCILLATORS

Alfred E. Popodi, Glen Burnie, Md., assignor, by mesne assignments, to the United States of America as represented by the Secretary of the Navy Filed Feb. 6, 1964, Ser. No. 343,170
1 Claim. (Cl. 331—117)

This invention relates to pulsed oscillators and is particularly directed to means for sharply starting and stopping oscillations in an oscillator in response to rectangular-voltage pulses.

Pulsed oscillators play an important role in such fields as telemetry, sweep circuits for displays, modulators, time measurements, and the like. Freedom from transients at the instant of the starting and stopping of the oscillations of the oscillator is probably more important to the designer than the establishment of a stable pulse amplitude or uniform pulse waveform. The requirement for transient-free operation rules out the continually running oscillator followed by a switch because there is no convenient way to establish a firm relationship between the randomly occurring gate pulse and the oscillator phase. The commonly employed pulsed oscillator shown in FIG. 1 consists of two tubes, V1 and V2 and the tuned tank circuit L–C. Tube V1 is the gating tube which is cut off during the oscillating period. Tube V2 is the oscillating tube which is always drawing plate current, with or without oscillations. One of the disadvantages of the circuits of FIG. 1 is that the gate voltage at the grid of tube V1 must greater than the oscillator peak amplitude to keep tube V1 from conducting during the oscillating period. This requirement is hard to fulfill if the gate voltage is a logic signal of relatively low level and if the high oscillator amplitudes are desired. Further, in circuits of the type shown in FIG. 1 it is often required that the oscillations start with full amplitude at the very first oscillator cycle after the input gate voltage appears, and to terminate the oscillations within less than one cycle without overshoot at the end of the gate pulse. That is, the oscillator must have fast rise time and fast decay at the beginning and end of the gate pulse. Still further, in the circuits of FIG. 1 the quiescent plate current of tube V1 determines the initial starting amplitude which is therefore dependent upon the tube current characteristic and consequently subject to large variations as the tube ages or becomes defective.

There is no obvious way to substitute transistors for the amplifier tubes V1 and V2. The alternating current voltage across the tuned circuit would appear between emitter and base of the gating transistor, exceeding its base-emitter voltage rating, unless the amplitude of oscillations were limited to low values.

An object of this invention is to provide an improved pulse oscillator which has fast rise time and fast decay time and has minimum transients at the beginning and end of the gate pulse periods.

A further object of this invention is to effectively transistorize a pulsed oscillator circuit.

Other objects and features of this invention will become apparent to those skilled in the art by referring to the specific embodiment described in the following specification and shown in the accompanying drawing in which.

Figure 1:
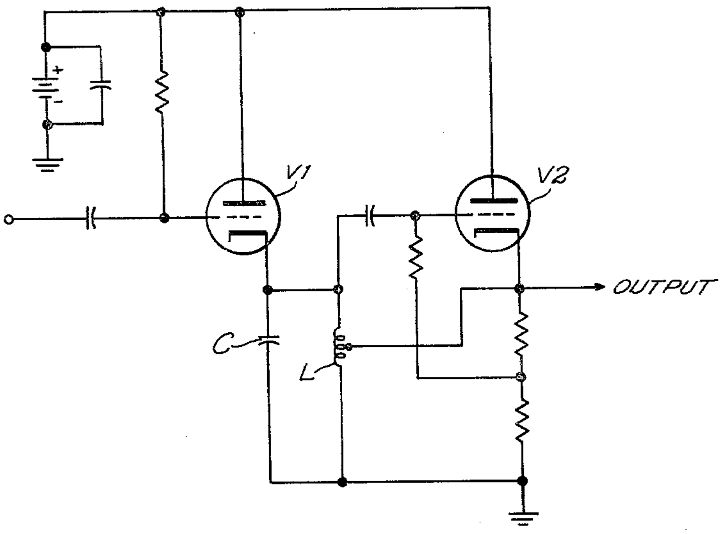
FIG. 1 (PRIOR ART)
FIG. 1 shows typical prior art.
Figures 2, 3:
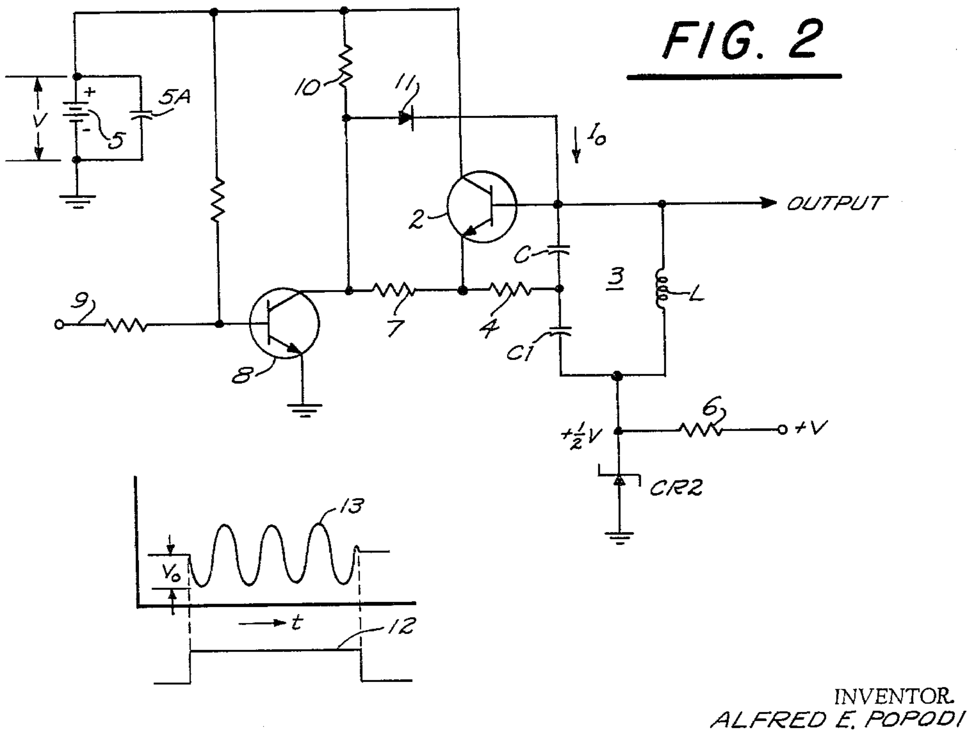
FIG. 2 is a circuit schematic diagram of one embodiment of the pulsed oscillator circuit of this invention.
FIG. 3 shows the waveform at the input and output terminals of the pulsed oscillator of this invention.

The oscillator amplifier 2 of FIG. 2 is a transistor and is operated in the emitter-follower configuration. The resonant circuit 3 of the oscillator comprises inductance L with capacitors C and C1 connected in series across the inductance. The feedback resistance 4 is connected between the emitter terminal and an intermediate tap of the resonant circuit condensers so that the feedback circuit has the appearance of the Colpitts oscillator. If the feedback resistance 4 were tapped into the inductance, L, after the fashion of the Hartley oscillator, a suitable blocking condenser would, of course, be required in the feedback circuit. The transistor 2 is of the NPN type, the collector being connected to the positive terminal of the voltage power supply source 5. At 5A is the usual bypass condenser. The tuning coil L of the resonant circuit is at a positive D.C. potential, established by the zener diode CR2 and resistor 6. The voltage is so divided as to establish the potential of the coil and the base of transistor 2 at about one-half the potential of the power source 5. If, for example, the power source is 28 volts the zener voltage should be selected at about 14 volts. The emitter resistance 7 is returned to the collector of the switching transistor 8. Switch means 8 is a transistor also of the NPN type, with its emitter grounded.

A binary gate voltage applied to input terminal 9 can drive the transistor between cut-off and saturation. The emitter-collector path of the switch transistor 8 includes a second circuit including resistor 10, this second circuit being connected across the voltage power source 5. The clamping diode 11 is connected between the collector end of resistance 10 and the base of oscillator transistor 2. When diode 11 is forwardly biased, its resistance is low, and the resistance 10 is effectively connected across the resonant tank circuit 3. When resistance 10 is connected across the resonant circuit, oscillations are effectively and completely damped.

In operation, when a positive gate voltage at input terminal 9 turns on transistor 8, power is applied to the oscillator 2 because the collector of switch transistor 8 is effectively connected to ground potential. Thereupon diode 11 is backbiased, the upper end of tank 3 is disconnected from ground and oscillations are free to occur. If, now, the gate voltage cuts off switching transistor 8, the collector voltage of transistor 8 rises toward the maximum power supply voltage until diode 11 starts to conduct. This places the damping resistor 10 across the tuned circuit causing the oscillation to decay rapidly, at the same time the emitter supply of oscillator 2 is effectively interrupted. The gate voltage at input terminal 9 thus effectively operates upon the oscillator in two important respects. First, the pulse switches on and off the direct current power through the oscillator transistor 2. Second, and simultaneously, the pulse effectively short-circuits the resonance tank circuit 3. These two simultaneous operations effectively prevent transients at the leading and trailing edges of the gate voltage pulse.

The direct damping current $I_0$ flowing in the coil is determined by the resistance 10 and is selected according to the relationship $V_0=\omega L \cdot I_0$ where $V_0$ is the desired A.C. peak voltage of the oscillator. This assures that every high frequency burst starts with the same amplitude, $V_0$, at the first cycle. Complete turn-off can also be obtained within one cycle. In FIG. 3 is shown the time relationship of the gate pulse voltage 12 appearing at the input terminal and the oscillating voltages 13 appearing at the output terminal of the system of FIG. 2.

Modifications and other specific details will occur to those skilled in the art without departing from the scope of the invention as defined in the appended claim.

What is claimed is:

In combination in a pulsed oscillator, (a) a direct current voltage source;

(b) a switching transistor having a control electrode and a controlled circuit;

(c) an oscillator transistor having an input, an output, and a common electrode; said controlled circuit of the switching transistor being coupled to said common electrode in series with the output circuit of said oscillator transistor;

(d) a resonant tank circuit, opposite ends of said resonant circuit being connected, respectively, to the input and output electrodes of said oscillator transistor and an intermediate point in said resonant circuit being connected to said common electrode to generate self-sustained oscillations, said voltage source being connected between said output electrode and one end of said resonant circuit;

(e) a damping resistor connected in series with said controlled circuit of said switching transistor, the series connected damping resistor and controlled circuit being connected across said direct current voltage source;

(f) a switching diode, one terminal of said diode being connected to the transistor-end of said damping resistor, the other diode terminal being connected to one end of said resonant circuit so that conduction of said switching transistor switches power to said oscillating transistor and nonconduction causes the diode to effectively insert the damping resistor in the resonant circuit to damp said resonant circuit.

References Cited by the Examiner

UNITED STATES PATENTS

| | | | |
|---|---|---|---|
| 2,470,573 | 5/1949 | Moore | 331—173 |
| 2,610,294 | 9/1952 | Seddon | 331—173 |
| 2,741,701 | 4/1956 | Harris | 331—173 |
| 2,809,286 | 10/1957 | Philpott et al. | 331—173 |
| 2,868,976 | 1/1959 | Hahnel | 331—173 |
| 2,889,410 | 6/1959 | Hatton | 331—173 |

ROY LAKE, *Primary Examiner.*

JOHN KOMINSKI, *Examiner.*